United States Patent [19]
Karner et al.

[11] Patent Number: 5,616,373
[45] Date of Patent: Apr. 1, 1997

[54] PLASMA CVD METHOD FOR PRODUCING A DIAMOND COATING

[75] Inventors: Johann Karner, Feldkirch, Australia; Erich Bergmann, Mels; Helmut Daxinger, Wangs, both of Switzerland

[73] Assignee: Balzers Aktiengesellschaft, Furstentum, Liechtenstein

[21] Appl. No.: 215,965

[22] Filed: Mar. 18, 1994

Related U.S. Application Data

[63] Continuation of Ser. No. 757,694, Sep. 11, 1991, abandoned.

[30] Foreign Application Priority Data

Sep. 14, 1990 [DE] Germany ............ 40 29 270.3

[51] Int. Cl.⁶ .................. B05D 3/06; C23C 16/26
[52] U.S. Cl. ............ 427/577; 427/580; 427/249; 427/122
[58] Field of Search ................. 427/577, 580, 427/249, 122; 423/446; 156/DIG. 68; 428/408

[56] References Cited

U.S. PATENT DOCUMENTS

| | | | |
|---|---|---|---|
| 4,509,451 | 4/1985 | Collins et al. | 118/50.1 |
| 4,731,255 | 3/1988 | Maeda et al. | 427/54.1 |
| 4,749,587 | 6/1988 | Bergmann et al. | 427/37 |
| 4,851,254 | 7/1989 | Yamamoto et al. | 427/37 |
| 4,859,490 | 8/1989 | Ikegaya et al. | 427/38 |
| 5,094,878 | 3/1992 | Yamamoto et al. | 427/577 |

FOREIGN PATENT DOCUMENTS

| | | |
|---|---|---|
| 60-118693 | 6/1985 | Japan . |
| 2-167891 | 6/1990 | Japan . |
| 2176808 | 1/1987 | United Kingdom . |
| 2178228 | 2/1987 | United Kingdom . |

OTHER PUBLICATIONS

Development of CVD Diamond Synthesis Techniques, S. Matsumoto, First International ECS Symposium, Los Angeles, 1989, pp. 1–11.

Diamond Film Preparation by Arc Discharge Plasma Jet Chemical Vapor Deposition in the Methane Atmosphere, Naoto Ohtake and Masanori Yoshikawa, J. Electrochem. Soc., vol. 137, No. 2, Feb. 1990, pp. 717–722.

"Diamond Synthesis By Hollow Cathode Plasma Assisted Chemical Vapor Deposition", B. Singh, O.R. Mesker et al., Spie vol. 877 Micro–Optoelectronic Materials, 1988, pp. 70–78.

"Growth Of Diamond Thin Films By Spiral Hollow Cathode Plasma–Assisted Chemical Vapor Deposition", Journal of Applied Physics, Bd. 65, No. 10, 15, Nov. 1989, New York, P. J. Kung and Y. Tzenig, pp. 4676–4684.

*Primary Examiner*—Roy V. King
*Attorney, Agent, or Firm*—Louis Weinstein

[57] ABSTRACT

The invention relates to a method for depositing a diamond coating on a workpiece, for instance a drawing die or a tool punch, whereby a reactive plasma supported coating method is used. According to the invention the generation of the plasma is made by a direct current discharge, whereby additionally a flow of charged particles is fed into the discharge gap; according to the invention the workpiece to be coated is positioned in the discharge gap. Due to the inventive design a relatively long discharge gap can be used, such that also large surface areas can be coated; the coating is made at a location of the highest homogeneity and density of the plasma. By means of the invention a method is provided which can be controlled regarding financial expenses and in a reliable manner and which is suitable for large surface area coating.

24 Claims, 5 Drawing Sheets

10

PLASMA CVD METHOD FOR PRODUCING A DIAMOND COATING

This is a continuation of application Ser. No. 07/757,694, filed Sep. 11, 1991.

BACKGROUND OF THE INVENTION

1. Field of the Invention

The present invention relates to a method of producing a diamond coating on an object by means of a reactive plasma enhanced deposition process.

It also relates to a vacuum treatment apparatus for the production of diamond coatings including a vacuum chamber, an inlet arrangement which opens thereunto for introducing a process gas which is brought to react at least partly in the chamber, and a draw-off arrangement for gaseous reaction product.

It relates further to a method of setting the temperature at a supporting element for an object to be treated, i.e., workpiece to be diamond coated in a plasma coating chamber.

2. Description of the Prior Art

In recent years, many methods of diamond coating have been proposed and tested. Hereto, reference is made to the general paper of S. Matsumoto, "Proceedings First International ECS Symposium on Diamond and Diamond-Like Films", Los Angeles, 1989.

The various known methods incorporated such severe problems that to the belief of the inventor until now, nobody has succeeded in designing apparatus which provides a diamond coating on a large technical scale. In many of the known methods, a glowing filament located close to the substrate is used. Heretofore, extremely thin wires having diameters <1 millimeter must be positioned at a distance of 1 to 2 centimeters from the surface of the object to be coated and maintained at about 2000° C.

Apart from the fact that such a coating technique for spacious surfaces such as of drawing dies or tool punches poses immense problems, the useful lifetime of the above-mentioned glowing coils or filaments is short because of their being subjected to the reaction process.

Also in methods where the generation of the plasma is made by means of microwaves or RF-discharges, problems occur specifically when larger surfaces, for instance, surfaces larger than 400 square millimeters, are to be diamond coated.

When using direct voltage glow discharges for the generation of plasma, these techniques lead to known and often proven problems that it is not, or only with great difficulties, possible to achieve a uniform density of the plasma on surfaces of three-dimensionally formed bodies. For the production of diamond coatings, their quality depends, however, very critically upon the distribution of the density of the plasma in the immediate neighborhood of the surface to be coated.

U.S. Pat. No. 4,851,254 discloses a method and apparatus for the production of diamond coatings. A direct voltage arc discharge is generated in a vacuum chamber across an anode/cathode space for the production of a plasma and the object to be treated is located outside of the cathode/anode space. The process gas for the reactive plasma enhanced coating process is fed in at distinct points and opposite the object to be treated with respect to the cathode/anode space.

Due to the displacement of the object with respect to the cathode/anode space and thus with respect to the maximum of density of plasma therein, the object may be maintained at lower temperatures such that a temperature of the object being treated at 800° C. can be installed during the coating only by applying additional heating.

The arc discharge occurs at low voltages due to the small anode/cathode distance at about 20 volts and at high currents on the order of about 40 amps. The object being treated is, however, arranged considerably distant from and outside of the plasma of a high power density generated by such an arc.

Thus, the plasma density produced by such procedure is not at all exploited for the coating process. The process is carried out at about 3500 PA process atmospheric pressure.

The drawback of this arrangement is that in spite of the high pressure, only an extremely short anode/cathode gap and a correspondingly short plasma space is used and that the larger object being treated located outside of the discharge gap or space is coated homogeneously only at a small area, or must be located at such a distance from the almost point-like discharge gap that it must be heated.

U.S. Pat. No. 4,859,490 discloses, furthermore, producing diamond coatings by a plasma enhanced, reactive deposition in that a glowing coil or filament is arranged in a vacuum chamber which relative to a grid, is connected to a cathodic DC-potential. Opposite the grid with respect to the glowing coil a support for the objects to be treated is provided, which, relative to the anodically-operated grid, is connected to a cathodic potential.

Process gas is led centrally along the glowing coil such that the plasma is produced in the cathode/anode space which is the glowing coil and the grid. Because the object between the cathodically-driven support is located outside of the anode/cathode space and, thus, again outside of the area of highest plasma density, low treatment temperatures between 600° C. and 1200° C. result.

The process pressure is stated to be between 700 and 28,000 Pa.

This procedure has the following drawbacks:

As already mentioned initially, also here the glowing coil is exposed to the process gas which on the one hand reduces its useful lifetime considerably and on the other hand leads, furthermore, to a cathode surface which is small regarding its extent, such that the conical expansion of the plasma occurs only due to the anodic grid with a corresponding decrease of the plasma density, specifically also at the location of the object being treated.

The article "Diamond Film Preparation by Arc Discharge Plasma Jet, Chemical Vapor Deposition in the Methane Atmosphere" of Naoto Ohtake and Masanori Yoshikawa, J. Electrochem. Soc., Vol. 137, No. 2, February 1990, discloses a process of diamond coating by the aid of a plasma beam. A gas is jetted at supersonic speed out of a nozzle cathode and the plasma is produced in the cathode/anode space having the anode extending perpendicularly to the cathode, and is led due to the jet impact linearally towards the object being treated. The object is cooled intensively because it otherwise would melt due to the high plasma jet temperature.

Apart from the cooling which must be foreseen, this procedure necessitates large expenditures for the generation of the plasma jet, and due to the restricted extent of the plasma jet only relatively small surface areas of the object can be coated.

The article "Diamond Synthesis by Hollow Cathode Plasma Assisted Chemical Vapor Deposition" of B. Singh, O. R. Mesker et al., Spie Vol. 877 Micro-Optoelectronic Materials (1988) discloses production of a diamond coating by means of plasma enhanced reactive coating in a vacuum chamber by producing between a hollow cathode and an anode grid or screen a plasma cone similar to the procedure according to U.S. Pat. No. 4,859,490 and arranging the object to be coated opposite the anode grid with respect to the cathode and connecting it to anode potential.

Apart from the fact that here, in contrast to U.S. Pat. No. 4,859,490, no glowing coil is used, with the drawbacks explained in connection with the above-mentioned publication, this procedure incorporates the same drawbacks as concerns the density of the plasma. Because the object to be treated is connected to anode potential, it must be cooled in case of high discharge currents.

SUMMARY OF THE INVENTION

Hence, it is a general object of the invention to provide a method of the kind mentioned above and a corresponding apparatus designed hereto which is relatively inexpensive, is reliably controllable and can be extended for producing large area coatings as well as for a three-dimensional coating of objects.

This is achieved by:

(a) generating the plasma by means of a direct voltage arc discharge in an anode/cathode space into which space electrically charged carriers are introduced.

(b) positioning the object to be coated into the anode/cathode space.

Thus, a further object is to provide a method encompassing the steps of generating the plasma by means of a direct voltage arc discharge in an anode/cathode space into which space electrical charge carriers are introduced; positioning the object to be treated into the anode/cathode space; selecting the process pressure as follows: 5 Pa $< p <$ 100 Pa; selecting the discharge current I per object surface to be coated, viewed perpendicularly to the cathode/anode spacing as follows: 0.8 kA/m$^2$ $\geq$ I.

By means of the features mentioned above, the following is achieved:

(a) Due to the introduction of electrically charged carriers, the arc discharge can be generated at substantially the same low discharge voltages as in the case of direct voltage arc discharges without the introduction of such charge carriers and at the same pressure conditions, but at substantially longer anode/cathode spaces, wherewith already a base is achieved for diamond coating of large surface areas;

(b) Due to the locating of the object to be treated between anode and cathode, thus within the anode/cathode space, the area of highest plasma density is exploited, and additionally an area of highest possible homogeneity of the plasma, at a treatment temperature on the order of 800° C. If desired, by controlling a current flowing off the object being treated of a desired value, the temperature of the object being treated can be set or negative feedback controlled.

(c) By arranging the object in the cathode/anode space, the plasma density prevailing in that space is exploited along a large area.

Preferred embodiments of the inventive diamond coating method are specified in the appended claims.

The Swiss Specification CH-A-664,768 discloses a general coating method and an apparatus, according to which a low voltage arc discharge is generated, and an opening arrangement is provided, through which a flow of electrically charged particles is coupled into the anode/cathode space in which the arc discharge is maintained.

At the here disclosed reactive plasma enhanced coating method, process gas with a gas portion which is to be brought to react is linearly jetted into the treatment chamber. A support for the object to be coated is located outside of the anode/cathode space.

The vacuum diamond coating apparatus on which the present invention is based departs from the recognition that this known kind of generating an arc discharge is excellently suitable for solving the above stated objects if the object to be coated is disposed into the anode/cathode space, thus into the area of highest plasma density.

By means of this inventive basic change, the coating arrangement disclosed in mentioned document CH-A-664 768 becomes suitable for diamond coating.

Further preferred embodiments of such a plant are specified in the claims.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENTS

Figure 1:
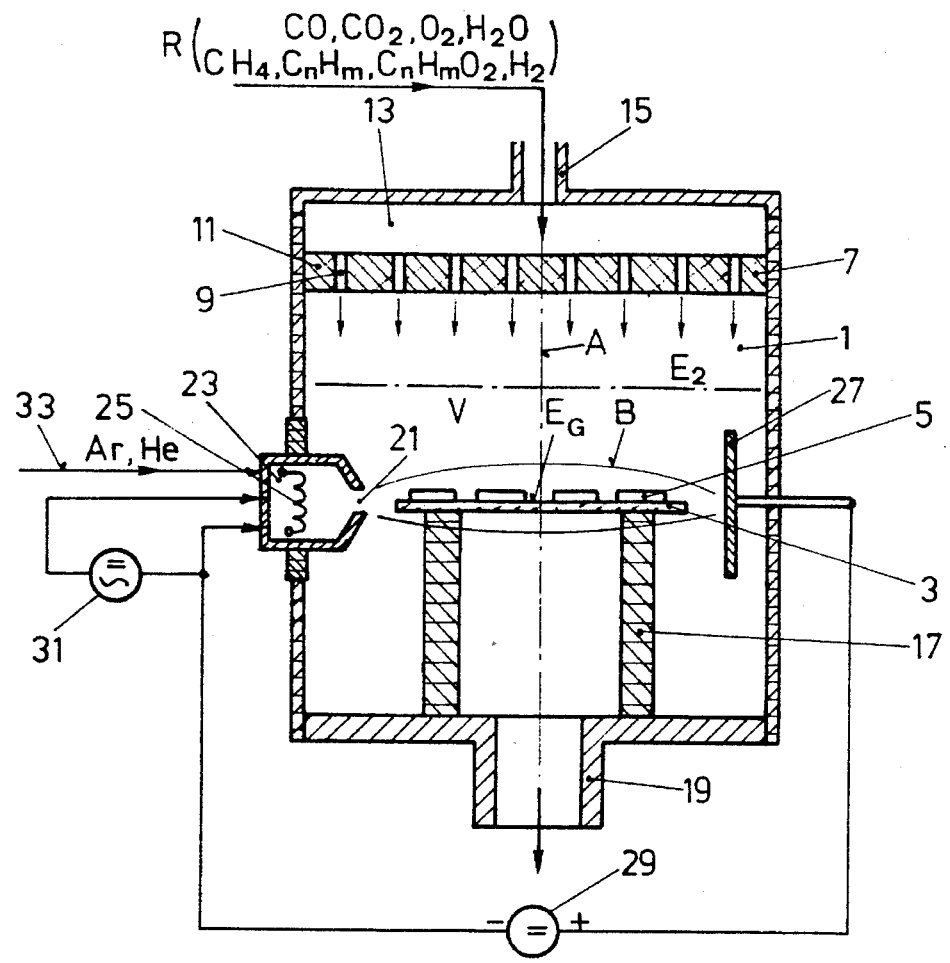
FIG. 1 illustrates schematically a first variant of an embodiment of an inventive arrangement for practicing the inventive diamond coating method.

FIG. 1 illustrates schematically a first variant of an embodiment of a treatment chamber for a diamond coating.

The object 5 to be coated, e.g., in form of a workpiece or as illustrated of a plurality of workpieces, is placed in a vacuum treatment chamber 1 on a support 3. The support 3 defines a supporting surface, here a supporting plane $E_G$ for the object to be coated. An inlet arrangement 7 for the process gas or gas mixture R, respectively, is located in the chamber 1 opposite of and facing the support 3 and thus the plane $E_g$.

The inlet arrangement 7 includes a two dimensionally or areally distributed arrangement of inlet openings 9 extending through a plate 11 and which are supplied by gas from a pressure equalizing chamber 13, which is opposite from the reaction space V of chamber 1 relative to the plate 11 and is supplied through one or a plurality of gas supply lines 15.

The support 3 in the illustrated exemplary embodiment is of a table-like design and is supported by insulated support means extending upwardly from and supported by the floor of chamber 1. Below the support 3 a draw-off line 19 is provided for evacuating chamber 1 and, during the treatment process, for drawing off gaseous reaction products or consumed process gas, respectively.

A hot-cathode chamber 23 is foreseen which communicates through an orifice opening 21 with the reaction space V of chamber 1, in which chamber 23 a directly or indirectly heated hot-cathode 25 is located. An anode 27 is provided in the chamber 1 opposite orifice opening 21.

In accordance with the schematic illustration, a DC voltage is applied between the hot-cathode 25 and the anode 27 such as is needed for maintaining an arc discharge B by means of a direct voltage (i.e., DC voltage) generator 29. The heating of the hot cathode is realized in case of electrical heating by means of a generator 31. This generator may be a DC or AC current generator, possibly with an isolating transformer (not shown) connecting its output to the cathode.

The volume of the pressure equalizing chamber 13 is of such a magnitude, that a uniform pressure distribution of the gas supplied through the line 15 is achieved therein at the inlet openings 9, and by means of the distribution of the inlet openings and/or, by their flow cross-sections and/or their axial length, thus via their flow resistances and/or their direction of outflow, a desired, substantially directional distribution of flow of the gas in chamber 1 is achieved in a well selected manner.

In the illustrated example a substantially uniform gas outflow directed towards the support 3 is realized by a uniform distribution and uniform design of the openings 9 along the plate 11. The process gas led into the reaction space V reacts therein partly to a portion which increases over time and at least partly used or consumed process gas is drawn off through the line 19.

Due to the distributed process gas inlet and the drawing off line 19 located substantially centrally relative to this inlet, respective substantially the same ratios of not consumed process gas to consumed process gas are achieved in the reaction space V along the dash-dotted planes $E_2$. Because the object to be coated is positioned by the support 3 on such a plane, uniform distribution of the coating effect at least upon surfaces areas of the object which are equidistant to this plane is realized.

Due to the direction and design of the inlet openings 9 and together with the arrangement of the drawing off line 19, the shape of the said equi-distribution surfaces $E_2$ is substantially determined, with surfaces $E_2$ in the illustrated example are planes extending parallel to each other. Because an arc discharge B is maintained in the here illustrated example in a small volume area only, its effect is not the same in the entire reaction space.

The internal surface of chamber 1 is preferably formed of a material which does not detrimentally internally influence the coating process, such as quartz glass.

The support 3 and thus the object to be treated are preferably and according to one variant, not connected to a selected electric potential, but such as realized by the insulating supports 17, operated at a floating potential. Thus, an electrical floating potential can be established thereon in accordance with the distribution of the electric potential in the reaction space V. By means of this, the coating temperature of the object is lowered, in contrast to the case where the object would be held at anodic potential as at anode potential.

In this fashion, a controlled diamond coating of an object having a large surface area is already possible by a reactive arc plasma enhanced method. The arc discharge generated in accordance with the described procedure is a long low-voltage discharge which is maintained at pressures of only a few Pa with a low DC voltage, e.g., below 150 V, usually at voltages on the order of the ionization energy of the process gas mixture, the voltage range found suitable being in the range of 20 V to 150 V and as low as 20 V to 60 V.

In order to prevent the gas brought in the reaction space to contact the hot-cathode 25 of which the material then could influence the coating process and would also react, wherewith the life span of hot-cathode 25 would be drastically reduced, a scavenging gas is preferably fed into the hot-cathode chamber 23, e.g., through a conduit 33. The pressure in the cathode chamber 23 can thereby be set somewhat higher than the process pressure in the reaction space V, so that a gas flow out of the chamber 23 is obtained.

An important matter during operation of low voltage discharges by hot cathodes is that an electrically neutral plasma flow exits from the ionization chamber into the coating chamber, thus an equal number of ions and of electrons. In any case, a process compatible gas is introduced as scavenging gas, usually a noble gas, such as Ar or He.

By means of the low voltage arc generated accordingly, a plasma with a relatively low gas temperature—at a high electron temperature—is generated on the order of 200° C. to 1000° C. This allows placing of the object to be treated between the cathode and the anode which is extremely advantageous for the diamond coating process which calls for a high plasma density at low object temperatures.

Figure 1A:
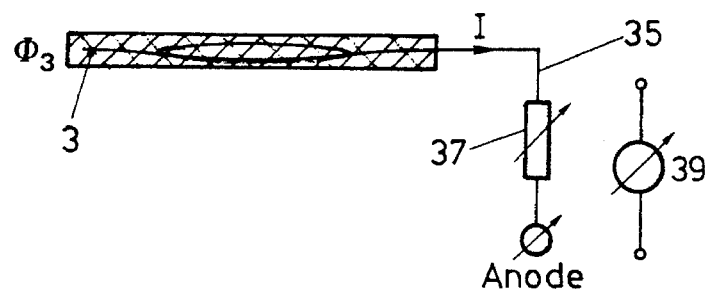
FIG. 1a illustrates an in itself inventive temperature controlling method for a support for an object to be treated, such as foreseen in FIG. 1.

FIG. 1a schematically illustrates a part of the support 3 of FIG. 1. It has already been mentioned that as a preferred variant due to the electrically floating potential mounting of the support 3, an electrical potential $\Phi_3$ corresponding to the distribution of the electrical potential in the reaction space V establishes thereat. Now, according to a further embodiment of the arrangement illustrated in FIG. 1, the support 3 is preferably connected via a current branch 35, over a resistance element 37 to a reference potential, e.g., to anode potential. Thus, a potential difference depending upon the impedance conditions in the reaction chamber V and the value of the resistance element 37 establishes via the latter, and the current I driven therethrough is used as a temperature control entity for the temperature of the support and thus of the object being treated. The control range is preferably between 0% and 20% of the current of the discharge.

Alternatively thereto, the potential of the object can be adjusted independently from the arc current by an adjustable voltage source 39 to be at a value between the anode and cathode potentials in the space V. Both of these procedures are specifically suitable for a fine adjusting or feed-back controlling of the temperature of the object being treated, which is of importance for the inventive coating method. For adjusting the "heating current"—value I the value of the resistance is adjusted about an operating point.

The temperature of the object being treated may also be adjusted by adjusting the potential of the object, decoupled from the discharge.

In order to feed-back control the temperature, the temperature of the support 3 is measured and, such as is now quite obvious for the person skilled in the art, an electrical signal which corresponds to the measured value is compared with a rated or reference value, and the resistance-value of the resistance element 37 and/or the voltage value at the voltage source 39, acting as respective adjustment elements, are adjusted in a feed-back controlled manner.

By varying the reference value during the treatment process, the temperature of the object being treated can be made to follow a pre-set time characteristic in the sense of a master feed-back control.

Departing from the arrangement according to FIG. 1, the following further development or embodiment steps for the diamond coating can be derived:

in place of or in addition to the predetermined distribution of operating gas inlet, the generating of predetermined distribution of long low-voltage arc discharge;

a considerable increase in exploitation of the volume of the reaction space V, by arranging the object to be coated on a plurality of distribution surfaces $E_2$.

It is not necessary to provide the drawing off line 19 centrally, it may also be provided peripherally and/or in a distributed manner.

Figure 2:
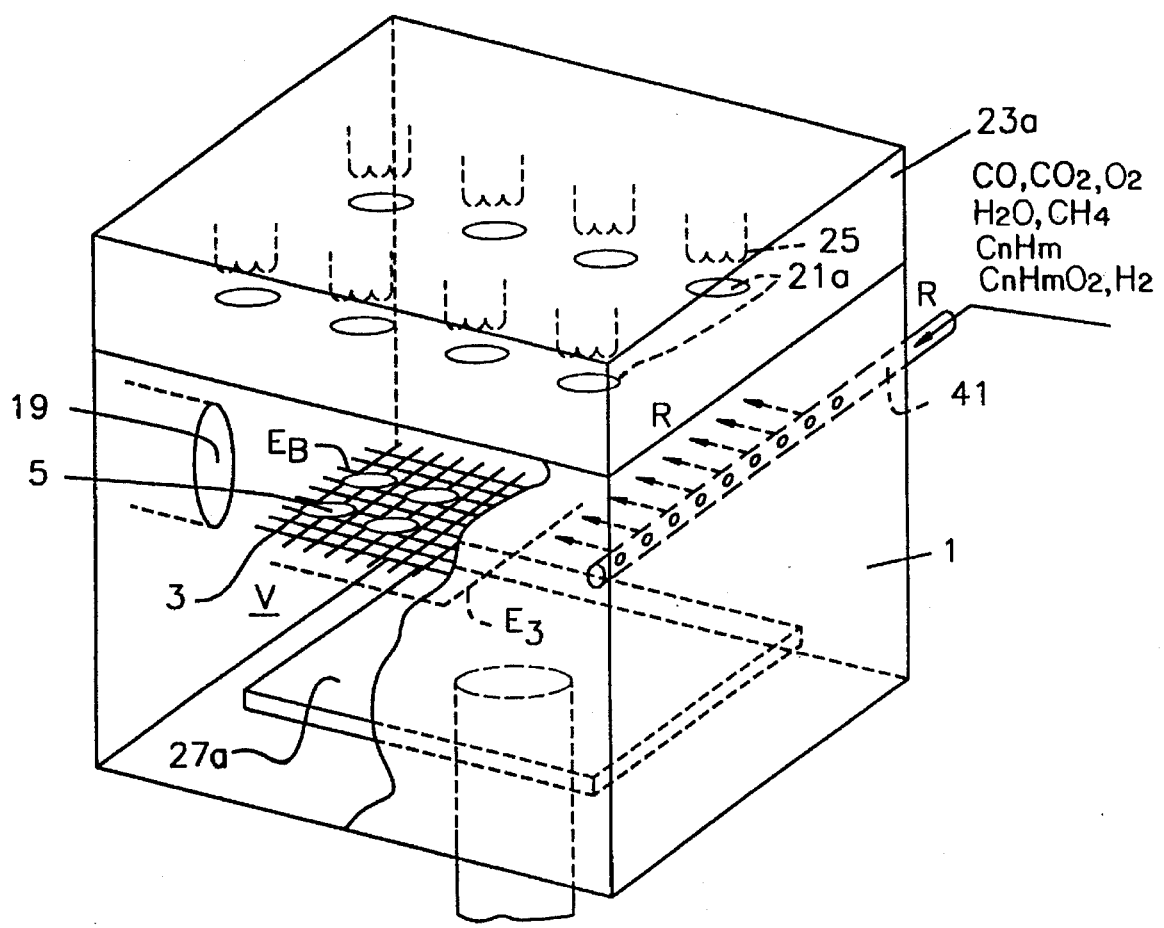
FIG. 2 illustrates schematically a second alternative embodiment of the arrangement in accordance with the invention.

FIG. 2 illustrates schematically a further arrangement of the present invention. It is here not the gas inlet which is designed in preselected, distributed manner, but rather the arc discharge.

Components illustrated in FIG. 2 which already have been described for the variant of the embodiment according to FIG. 1 are identified by the same reference numerals.

A hot-cathode chamber arrangement 23a is foreseen at the coating chamber 1 which is here designed in a cubic or parallelepiped shape and to which the process gas R is fed via a supply line 41 which is perforated near one end such that the process gas R is in this case not areally distributed. The hot-cathode chamber arrangement 23a extends along a wall of the parallelepiped wall of chamber 1. One or a plurality of hot-cathodes 25 are foreseen in this arrangement distributed in two dimensions areally.

The cathode chamber arrangement 23a which obviously can also be formed by individual, separated chambers which are distributed accordingly, communicates via a plurality of orifice openings 21a with the reaction space V of chamber 1. A rectangular or square, respective anode 27a, is located in chamber 1 opposite orifices 21a. A supporting screen 3 for the objects 5 to be coated is arranged mutually to the direction of discharge. The draw-off line 19 is located at the side of the parallelepiped facing toward process gas supply 41. The plurality of arc discharges which here are distributed in two dimensions, i.e., areally lead along planes $E_B$ to a sufficiently uniform coating for a number of coating demands in spite of the not areally distributed infeed of the process gas. Also here the uniformity of the coating can be influenced by selected, predetermined distribution of discharges. $E_3$ refers to planes along which the density of the plasma is substantially constant, for equally distributed and equally operated anode/cathode arrangements.

By selected areal or spacial distribution and/or selected controlling of respective single or groups of anode/cathode sets, the spatial distribution of the plasma in the reaction space V is influenced. Accordingly, it is possible that the spatial diamond coating distribution by means of the described long low-voltage arc discharge can be set either by selected large areal distribution of the process gas inlet and/or by selected spatial distribution of the arc discharges, such that objects having large surfaces or simultaneously a large number of objects can be treated, and this also in a three-dimensional arrangement.

It may now be seen that the two measures according to FIG. 1 and FIG. 2 are preferably combined in that the gas inlet is generated with selected areal distribution, and also the arc discharges are generated with selected spatial distribution. Hereinafter, such a preferred arrangement will be described.

It has been recognized that the above-mentioned two-dimensionally uniform coating distribution achieved in accordance with FIG. 1 and FIG. 2, respectively, proceeds into a three dimensional uniform distribution if the anode/cathode direction and the direction of the gas consumption set predominantly by inlet and outlet are mutually equal or opposite.

Figure 3:
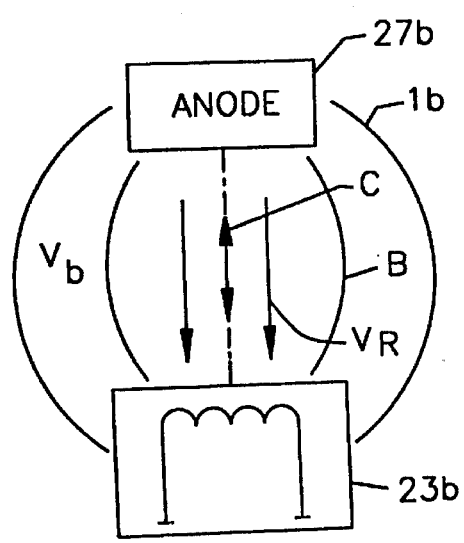
FIG. 3 illustrates schematically a combination of the procedures according to FIGS. 1 and 2, designed as a schematic block illustration.

This procedure is illustrated in principle in FIG. 3, in which an arc discharge B proceeds between a hot cathode arrangement 23b and an anode arrangement 27b in a substantial volume area of a reaction space $V_b$ of a chamber 1b in the same direction C as the direction $V_R$ of the consuming of the reaction gas set between the process gas inlet and the draw-off line. Such preferred embodiments shall now be disclosed, which embodiments shall illustrate combining the procedures according to FIGS. 1, 2 and 3.

Figure 4:
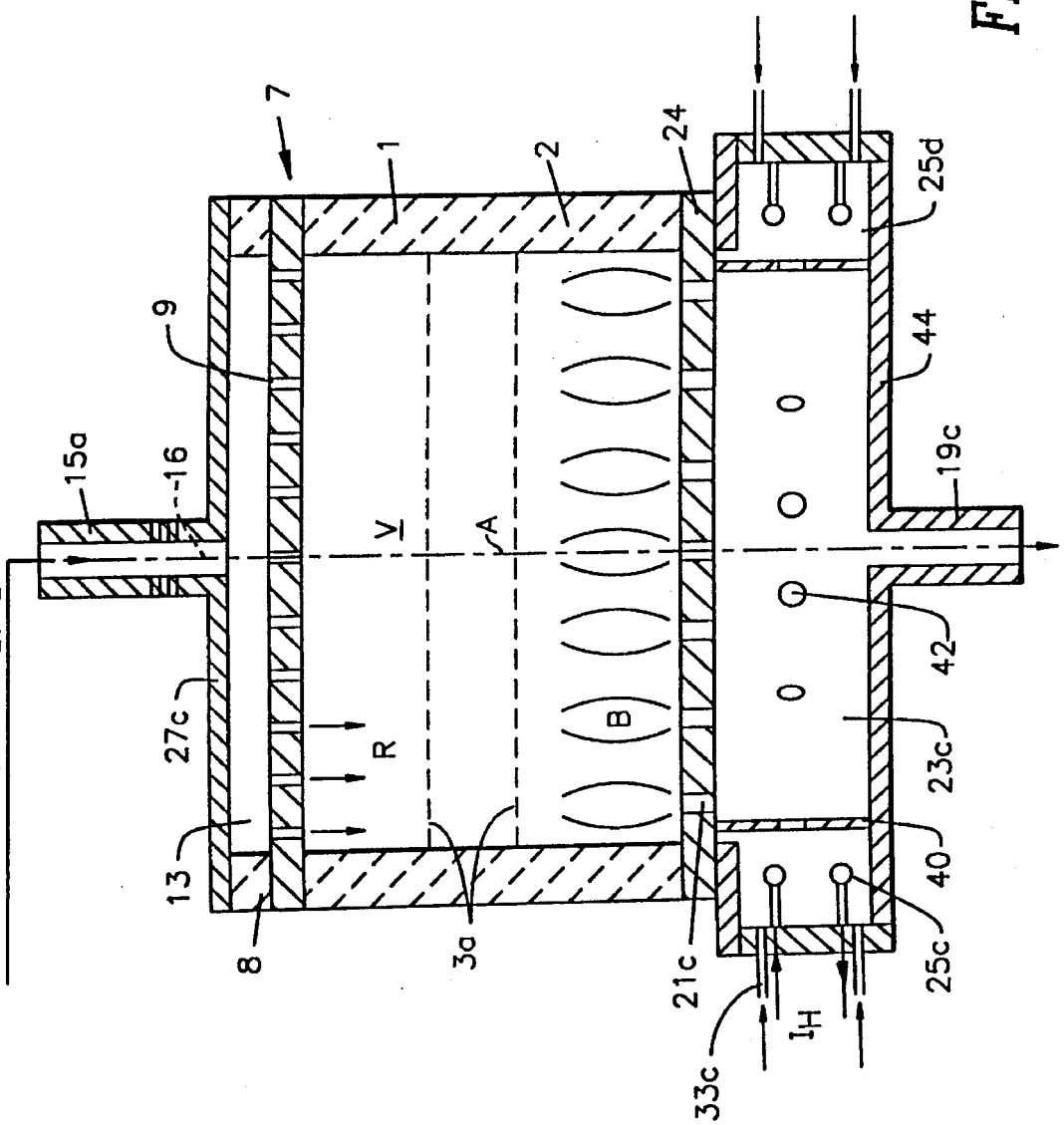
FIG. 4 is a schematic longitudinal section through a preferred arrangement, making use of the procedure according to FIG. 3, for the diamond coating.

The basic design of a first variant of such embodiments is illustrated schematically in FIG. 4. Chamber 1 includes a cylinder wall 2 of quartz. The reaction space V defined by the wall 2 is limited at the one side by the inlet arrangement 7 with openings 9 for fresh process gas R incorporating at least one carbon donor gas (see gases listed in any of FIGS. 1, 2 or 4). Upstream relative to the direction of outflow of fresh gas an anode plate 27c having an electrically insulated wall section 8 forms the pressure distribution chamber 13, whereby the fresh process gas R is fed in through a line connection 15a having a central feed-in 16 through the anode plate 27c into the pressure distribution chamber 13. Line connection 15a may be electrically insulated from anode plate 27c, as shown.

A plurality of supports or substrate supporting screens 3a, respectively, are arranged to be aligned with planes extending substantially perpendicular to the axis A of chamber 1. The reaction space V is closed off at the other side relative to the gas-inlet arrangement 7 by an orifice plate 24 having outlet orifices 21c for the schematically shown arc discharges B. The supports are preferably arranged to expose the objects being treated to a plasma density which is preferably in the range of 20% to 100% of the plasma density maximum in the anode/cathode space.

An annular-shaped hot-cathode chamber 25d is foreseen adjacent the orifice plate 24 in which chamber 25d, e.g., a directly heated hot-cathode coil 25c extends for instance along the periphery thereof, coil 25c being directly heated by a heating current $I_B$. A here not illustrated low voltage generator is connected between the anode plate 27c and the hot-cathode 25c. Scavenging gas lines 33c open into the area of the hot-cathode 25c by means of which a scavenging gas such as argon or helium is fed into the area occupied by hot-cathode 25c.

By the gas which is fed in at the area of the hot cathode 25c, the cathode is protected from effects of the coating process. This leads to a substantial increase in the useful lifetime of the hot-cathode.

In the illustrated embodiment, the hot-cathode 25c is surrounded by a coaxial orifice-plate 40 having radially directed openings 42. By means of this, a pressure gradient towards the center of the chamber 23c is possible.

At its one face, the cathode chamber 23c is closed off by a cover part 44 having a central draw-off line 19c. The orifice plate 24 is preferably cooled (by means not illustrated for purposes of simplicity). The orifice screen or plate 40 is preferably made of tantalum or of ceramics.

As already mentioned, the process gas R is fed through the inlet openings 9, preferably in a uniformly distributed manner, into the reaction space V. The arc discharge is maintained out of the e.g. uniformly distributed orifice openings 21c and also, via the openings 9 of the arrangement 7, by the anode 27c. At the same time, gaseous reaction products flow through the orifice openings 21c, in a counter current fashion relative to the electron flow of the arc discharge, and through the central area of the cathode chamber 23c out of the draw-off line 19c.

The workpieces or objects to be treated are placed upon substrate supporting screens 3a operated e.g. at a floating potential or, in order to regulate or control, respectively, the temperature, connected via a current branch such as explained with reference to FIG. 1a to a reference potential or a control voltage source.

Figure 5:
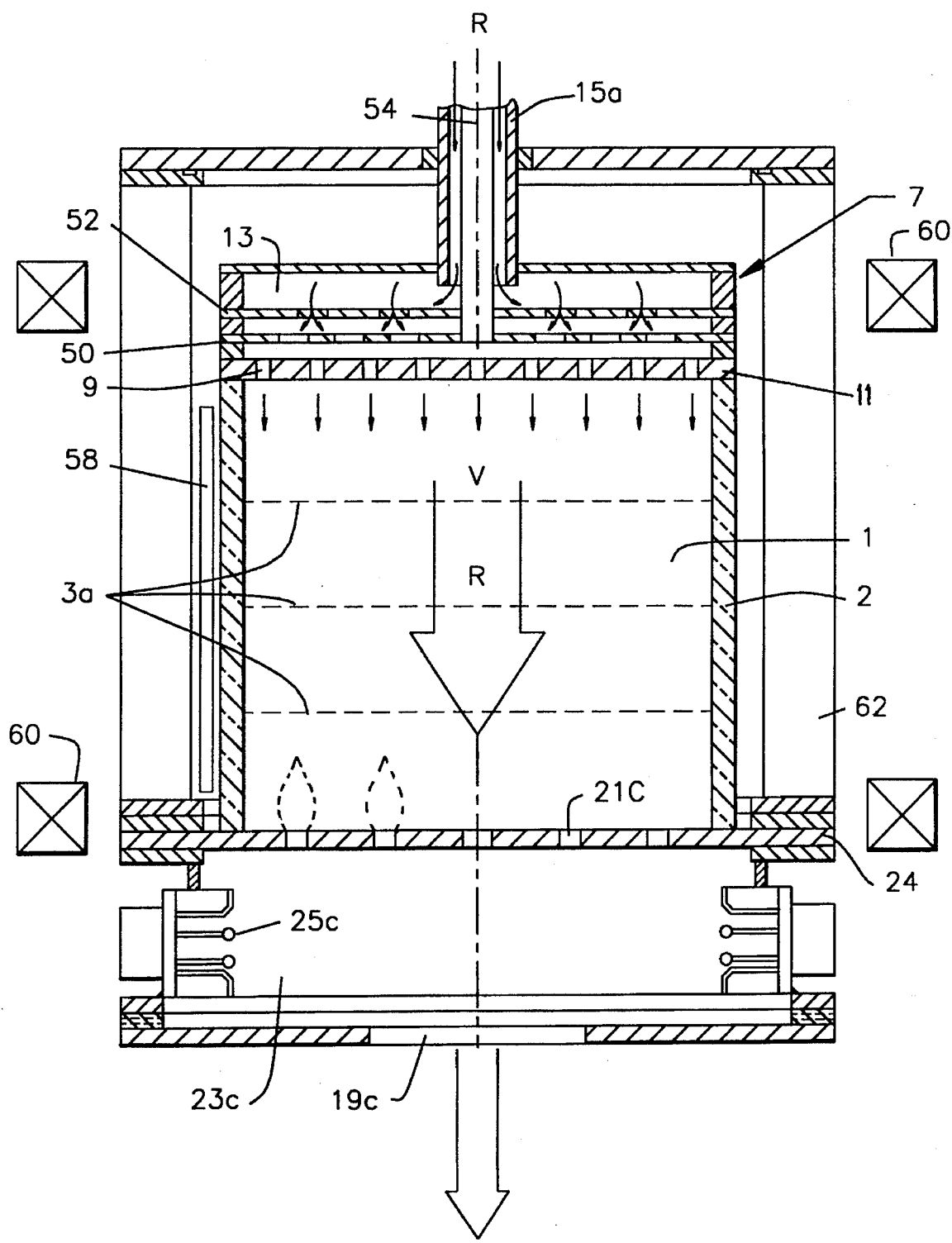
FIG. 5 is a longitudinal section of the arrangement according to FIG. 4 showing in more detail an embodiment, such as presently preferred, for the diamond coating.

In FIG. 5 a presently preferred variant of an embodiment of a coating chamber applied in accordance with the invention is illustrated on a more detailed basis. Reference numerals of structures described earlier above remain hereinbelow the same.

Chamber 1, having a quartz glass wall 2, is at one side defined by the inlet arrangement 7. Behind the inlet plate 11 with inlet openings 9 for the process gas, which plate here is also made of quartz, a cooled anode plate 50 perforated by openings of relatively large diameters is located distant from the plate 11 and electrically insulated. A further perforated plate 52 which in turn is distant from the anode perforated plate 50, serves to provide an improved distribution of the gas. The electrical supply 54 for the anode is located centrally in the central process gas supply tube 15a.

The pressure distribution chamber is formed here by two pressure stages between the two distribution plates 52 and 11. The anode plate 50 is designed to provide as little disturbance as possible to be "transparent" for the process gas, on the one hand in order not to disturb the flow of the gas, and on the other hand to be detrimentally influenced as little as possible by the gas or coated in a disturbing manner, respectively.

By means of this arrangement an optimal, homogeneous distribution of the gas is arrived at the here equally designed gas inlets 9 and in the same instance a cooling of the anode 50 is achieved.

Optional heating rods 58 may be provided outside of chamber 1, as shown.

Furthermore, magnet coils 60 may be provided outside of chamber 1 and coaxially to the anode/cathode set in order to optimize by means of magnetic direct or alternating fields the distribution of the plasma in the reaction space V with the supports 3a.

The outer chamber with the optional heaters 58 is closed off by an outer wall 62.

Figure 6:
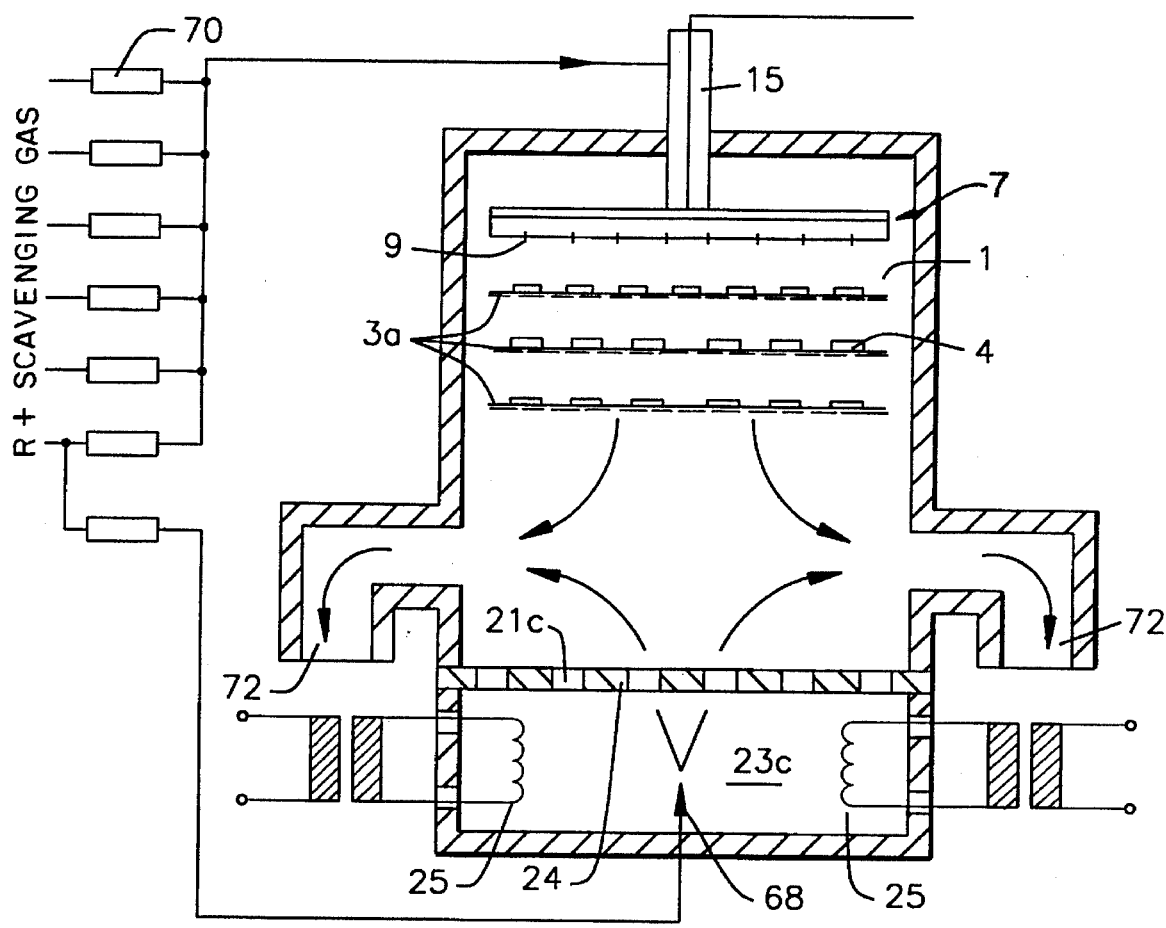
FIG. 6 illustrates schematically a further variant of an embodiment of an apparatus used for diamond coating, following the principle according to FIG. 3 and corresponding partly to the embodiment according to FIGS. 4 and 5.

FIG. 6 illustrates schematically a further coating chamber applied for the method in accordance with the invention, and in which the drawing off of the scavenging gas which is fed in through the schematically illustrated inlet 68, and also of the process gas which is fed in such as explained above through the inlet 15 proceeds peripherally. The above already used reference numerals are used again such that the arrangement illustrated here can be understood by the person skilled in the art without any further ado.

By a corresponding design of the openings in the orifice and distribution plate 24, a pressure is set in the ionization or cathode, respectively, chamber which is larger than the pressure in the treatment space. By means of this, a specifically effective ionization of the gas is achieved. Because the gas in the ionization chamber 23c is substantially a noble gas, the useful lifetime of the cathode arrangement is increased significantly. The noble gas in the atmosphere of the process is preferably between 50% and 90% of the gas mixture.

Objects 4 to be coated are shown schematically and are located on carriers 3a. The reference numeral 70 identifies generally gas-flow controllers on the one hand for the process gas R supplied via the connection 15, and on the other hand for the scavenging gas supplied via the supply line 68.

The gas drawing off proceeds at the draw-off connections 72.

The following dimensions which are relatively critical values have proven themselves up to now positively:

density distribution $D_{21}$ of the openings 21c in the orifice plate 24 : $D_{21} \geq 10/m^2$; preferably $D^{21} \geq 50/m^2$;

diameter $\Phi_{21}$ of the openings 21c in the orifice plate 24; 1 mm $\leq \Phi_{21} \leq 8$ mm;

density $D_9$ of the openings 9 in the plate 7: $D_9 \geq 500/m^2$ preferably $D_9 \geq 2000/m^2$;

diameter $\Phi_9$ of the openings 9 in the distribution chamber 7: 0.5 mm $\leq \Phi_9 \leq 10$ mm.

Figure 7:
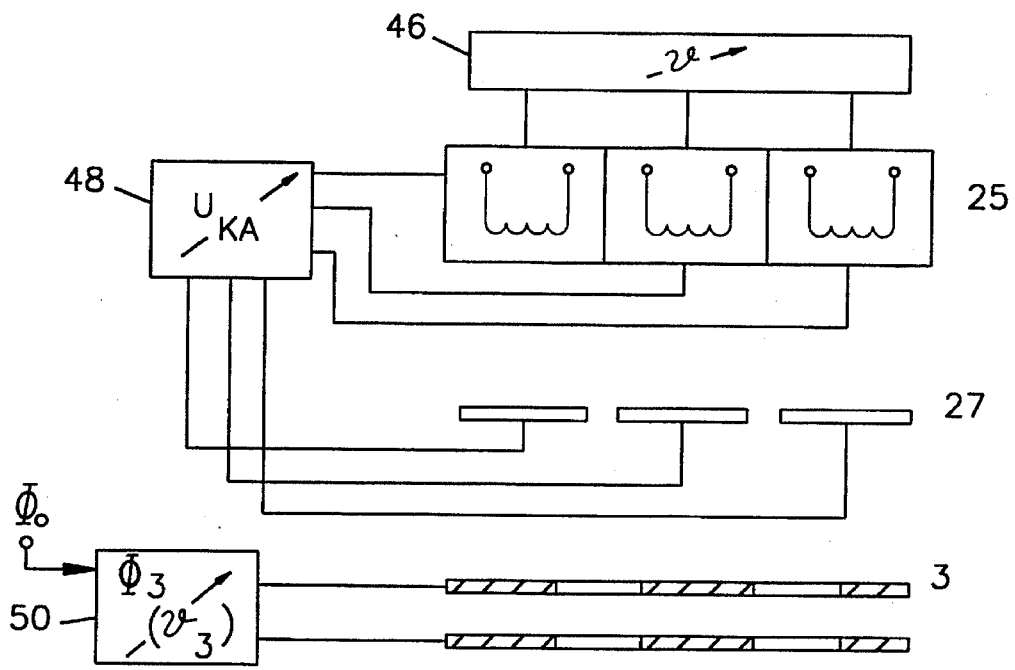
FIG. 7 illustrates schematically the electrically operated units in an apparatus in accordance with the invention and their setting or controlling, possibilities shown by a function block diagram.

FIG. 7 illustrates schematically the electrically operated parts of the inventive arrangement. These include: one, or as illustrated more than one hot-cathode 25; one or more than one anode 27; one or more than one support 3 for objects to be treated.

One or more than one of the following values may be adjusted for optimizing the treatment process:

In the case where more than one hot cathode is employed, their operating temperatures, such as in the case of directly heated hot cathodes, their heating current, may be e.g. selectively set for an optimizing of the distribution of the arc discharge. This is realized by an operation temperature control unit 46.

If more than one anode 27 and more than one hot-cathode 25 is present and in an analogous manner one hot-cathode and more than one anode or one anode and more than one hot-cathode, respectively are provided, the respective low voltage values of the anode/cathode voltages $U_{KA}$ may be set selectively at a control unit 48 for optimizing the arc discharge distribution.

The electrical operating potentials of the supports 3 which in this case consist at least of sections of a conductive material, are at least influenced at a selective adjusting unit 50, which may be by means of voltage sources 39 according to FIG. 1a and/or adjusting of the value of the resistance in a current branch 35 according to FIG. 1a, specifically for a fine adjustment of the temperature of the object or of the electron bombardment of the growing coating.

The illustrated coating apparatus for obtaining a reactive, low-voltage arc plasma enhanced diamond coating operate at low anode/cathode voltages, for instance below 150 V, with high discharge currents per object support surface area, for instance more than 4000 A/m$^2$ and lead to low treatment temperatures, substantially below 900° C. High plasma densities at low treatment temperatures are achieved therewith.

Below, some examples of the inventive diamond coating process are now presented which have been made by means of treatment apparatus according to FIGS. 5 or 6.

EXAMPLE 1

Silicon substrates which are pretreated by a diamond paste and having the dimensions 20×10×1 mm were placed upon a substrate screen having a diameter of 360 mm and which was arranged between the cathode and anode electrodes. The substrate screen including the substrates was electrically insulated from the cathode and anode. The coating chamber was evacuated to a pressure of <0.1 Pa. After igniting of the plasma in a pure argon atmosphere, whereby 20% of the argon was fed in through the ionization chamber or hot cathode chamber, respectively, and 80% through the anode (the Ar-flow amounted to 90% of the total flow) 9% $H_2$ was added through the anode. Because a part of the argon flow was fed in through the ionization chamber and because additionally, due to the orifices in the cover of the hot-cathode chamber a pressure prevailed therein which was higher than the pressure in the coating chamber, the hot-cathodes were immersed in the argon flowing therearound and were not directly exposed to the $H_2$-flow. By this means a long useful life span of the hot-cathodes was obtained. Thus, the hot-cathodes could be used for twenty 10-hour coating runs. The substrates were thereby located directly in the plasma between the anode and cathode. The arc current was set to about 650 A—which corresponds to a current per substrate support surface of about 6,4 $kA/m^2$—, such that the substrates in the plasma were heated up to a temperature of 800° C. The arc voltage amounted to 70 V, the floating potential of the substrate was 35 V lower than the anode potential. After reaching the above-mentioned temperature, 1% $CH_4$ was admixed with the process gases. The measuring of the gas flows of the various gases was made by mass-flow controllers. By feed-back controlling of the drawing-off power of the vacuum pump, the coating pressure was set to 400 Pa. By fine feed-back controlling of the arc current (see FIG. 1a) the coating temperature which was measured by means of thermo elements was maintained at 800° C. After a coating time of 5 hours, the substrates were cooled and removed from the chamber.

The coatings which were produced accordingly displayed in the raster electron microscope sharply edged crystals with a grain size from 0.5 to 5 µm which have grown together to a dense layer, whereby the crystals incorporated predominantly a [100]- facet. The thickness of the coating amounted to 5 µm. In a Raman-Spectrum the diamond peak could be proven to be at 1333 cm-1. The interlattice plane distances derived from the electron diffraction pattern of a coating removed from the substrate corresponded to the interlattice plane distances of the diamond structure.

In a further test the $CH_4$-flow was reduced to 0.7% whereby the other parameters remained unchanged. At a somewhat smaller coating rate of 0.8 µm/h the coatings had then predominantly a [111]-facet.

At a $CH_4$-gas flow of 0.3% the silicon substrates remained uncoated after a 5 hour coating treatment, however a strong etching of the silicon surface was observed. This indicates that the $CH_4$-flow was so low that nuclei which were generated were again etched off.

In comparison with other diamond coating methods, the $CH_4$-flow is relatively high because, due to the gas inlet at the side of the anode, a part of the gas is consumed at the anode having a large surface. Due to the low coating temperature due to the intensive cooling, an amorphous carbon coating is precipitated on the anode.

At a $CH_4$-flow of 2.5%, an amorphous carbon peak only could be observed in the Raman-Spectrum. The coating itself did also not comprise any crystals which could be recognized in the REM. After this coating had been etched for one hour in a $Ar/H_2$-atmosphere, sharply edged crystals with a [100]-facetting could again be observed in the REM. This reveals that portions of amorphous carbon in the coating are etched substantially faster than diamond crystals, which, due to the low sensitivity for the Raman-diffraction, could not be observed in the spectrum.

EXAMPLE 2

Prepared silicon substrates were placed onto the substrate screen which was connected to the anode via an ohmic resistance. After the heating up in a $Ar/H_2$-atmosphere, 1% $CH_4$ was again fed thereto. An arc current of about 600 A was set, corresponding to a current density per substrate supporting surface of about 5.9 $kA/m^2$, and via the resistor (FIG. 1a) per $cm^2$ coating surface a current I of about 0.5 A was drawn off over the substrates and the substrate supporting screen.

By this means, the potential of the substrate was raised from floating potential in the direction towards the anode potential and by a regulating of the current via the variable resistor the temperature of the substrates could be set. By the raising of the potential of the substrate in the direction toward anode potential, the energy of the ions impacting the substrate was decreased.

Langmuir-probe measurements gave an electron energy of 15 eV whereas the ion energy in the plasma was considerably lower.

The process time amounted to 5 hours at a coating temperature of 800° C. The coatings displayed again crystals with a [100]-facetting. Due to the possibility of exactly feed-back controlling of the temperature by means of the substrate carrier current, a more exact conducting of the process was possible.

EXAMPLE 3

The coating process was performed as in Example 2, however, the potential of the substrates was set instead by the variable resistor by an additional direct voltage generator between cathode and substrate screen. The advantage of this arrangement consists in the decoupling of the plasma power from the coating temperature: At constant parameters of the arc which determines the excitation of the gas particles, the coating temperature can be set independently therefrom.

At an arc current of 500 A and an arc voltage of 60 V a current of 0.5 A per $cm^2$ coating surface was necessary for reaching the coating temperature of 800° C. Thus in this way deposited coatings had a [100]-facetting.

In a further test, silicon substrates with the dimensions 15×20×1 mm were placed upon an upper substrate supporting screen, hard metal turn-over cutter blades (i.e., cutter blades of a block shape presenting up to 8 cutting edges) having the usual dimensions 12.7×12.7×2 mm were placed on a substrate supporting screen located below the former screen. Because small substrates are heated more than large surface substrates in the plasma, differing currents I (FIG. 1) were needed for setting the same temperature on both substrate planes, which currents could be set by a differing voltage supply to the individual substrate screens. Diamond coatings with a [100]-facetting were deposited on the silicon substrates and the turn-over cutter blades, as well.

EXAMPLE 4

Silicon substrates, used without a pre-treatment by grinding agents, were used as substrates. Using a process procedure as set forth in Example 1, it was again possible to deposit diamond coatings, but the density of the nuclei was less than in case of the pre-treated substrates. Less, but larger crystals were produced.

EXAMPLE 5

The coating process was conducted with a gas composition of 60% Ar, 33% $H_2$ and 7% $CH_4$ at a coating temperature of 800° C. At an arc current of 450 A the arc voltage amounted to 100 V. The process pressure amounted to 400 Pa, the silicon substrates were at a floating potential. At the higher $H_2$ portion in the plasma, the arc voltage increased, but at the increased addition of $CH_4$ the arc became unstable such that the arc had to be reignited several times.

EXAMPLE 6

Ceramic turn-over cutter plates were coated at a pressure of 20 Pa and a temperature of 780° C. The composition of the gas was 9% $H_2$, 2% $CH_4$ and 89% Ar. The arc current amounted to 620 A at an arc voltage of 70 V. In a 10-hour depositing process, coatings of a thickness of 11 μm were deposited. The coating consisted of "ball-like" diamond crystals generally known from the literature and which are produced at higher $CH_4$-flows.

EXAMPLE 7

The coating process was conducted as set forth in the Example 2, however $CO_2$ was used as additional coating gas (Ar: 88%; $H_2$:9%; $CH_4$:1%; $CO_2$:2%). At a coating temperature of 800° C. it was therewith possible to increase the diamond portion in the coatings such as revealed in the Raman-Spectrums. Object 3 treated in this manner produced coatings having a pronounced [111]-facetting.

EXAMPLE 8

The coating process was conducted as in Example 7, however, in place of $CO_2$, $O_2$ was used as additional coating gas. The gas composition was 89% Ar; 9% $H_2$; 1.5% $CH_4$ and 0.5% $O_2$. The coatings had a pronounced [111]-facetting.

EXAMPLE 9

The coating process was conducted as in Example 1, but the gases $H_2$ and $CH_4$ were not fed in through the anode, but through a gas supply placed at a floating potential directly into the coating space. Also in this configuration it was possible to deposit diamond coatings onto silicon substrates. A smaller $CH_4$-flow was needed because at the anode not such a strongly pronounced gas consumption occurred as is the case at an anodic infeed of the $CH_4$.

EXAMPLE 10

The same arrangement as in Example 1 was selected and the same parameters were set. However, the arc current was controlled to 750 A, at an arc voltage of 80 V, such that the coating temperature amounted to 900° C. The coatings deposited in this manner no longer displayed any sharply-edged crystals, but rather a soft, graphite-like black coating.

EXAMPLE 11

The process procedure was the same as in Example 3, but the coating temperature at the beginning of the coating process was held lower than during the coating process. By this means, a better quality of the crystals close to the substrate was obtained which was proven by REM-recordings. This Example reveals that the optimal coating temperature during the phase of the forming of the nuclei is different from that at the subsequent growing process. Employing the same coating temperature during the nucleus forming phase and during the crystal growing phase the structure of the crystals close to the substrate was not as sharp-edged than at some distance from the substrate surface.

EXAMPLE 12

In this Example, the plasma was not uniformly distributed over the substrate screen. By applying a magnetic field in the axial direction of the arc and a corresponding configuration of the anode- and ionization chamber, the density of the plasma strongly decreased in the radial direction of the arc towards the outside. In the area of the lowest density of the plasma (about 50% of the maximal plasma density) it was also possible to deposit diamond coatings, but the parameters which were necessary for the depositing of the diamond structure were due to the differing density of the plasma strongly dependent from the radial position of the substrates. Therefore, it was indeed possible to deposit diamond coatings in a small area, but a homogeneous coating over larger areas was not possible.

While there are shown and described present preferred embodiments of the invention, it is to be distinctly understood that the invention is not limited thereto, but may be otherwise variously embodied and practiced within the scope of the following claims:

What is claimed is:

1. A method of producing a diamond coating on at least one object by means of a reactive plasma enhanced deposition process, wherein said plasma is generated as a low voltage arc discharge and with the aid of a carbon donor gas, comprising the steps of:

(a) introducing said gas into a vacuum chamber;

(b) generating said low voltage arc discharge in said vacuum chamber by applying DC voltage energy from a first independent energy source to electrodes defining an anode/cathode discharge space and introducing electrically charged carriers generated by a second independent energy source into said discharge space;

(c) establishing in said discharge space a gas pressure p in a range of $$5\ Pa < p < 1000\ Pa$$

(d) generating said discharge with a discharge current I per unit surface area aligned along a plane perpendicular to a line extending between the electrodes defining said anode/cathode discharge space as follows:

$$0.8\ kA/m^2 \leq I,$$

(e) generating said plasma discharge with a substantially uniform plasma density along planes perpendicular to said line by introducing said electrically charged carriers into said discharge space through a multitude of openings distributed in a plate arranged perpendicular to said line; and (f) arranging said at least one object to be coated on a plane perpendicular to said line and within said discharge space.

2. The method of claim 1 wherein a range of said pressure p is as follows:

$$10\ Pa \leq P \leq 100\ Pa.$$

3. The method of claim 1 wherein said direct voltage energy is in a range of 20 V to 150 V.

4. The method of claim 3 wherein a range of said voltage is from 20 V to 60 V.

5. The method of claim 1 wherein a surface of said object to be coated is placed in an area of said plasma discharge having a plasma density in a range of between 20 percent and 100 percent of maximum plasma density of said discharge.

6. The method of claim 1 further comprising the step of maintaining said object being coated at a floating electrical potential.

7. The method of claim 1 further comprising the step of coupling an electric current to said object being coated.

8. The method of claim 1 further comprising the step of maintaining said object being coated at a preselected electric potential.

9. The method of claim 7 further comprising the step of adjusting said temperature of said object being coated by adjusting a current applied to said object.

10. The method of claim 1 wherein said charged carriers are generated by providing a hot electron emitter, heated by said second energy source.

11. The method of claim 10 further comprising the step of providing a cathode of said anode/cathode space which also serves as said hot emitter.

12. The method of claim 1 wherein step (a) further includes providing a carbon donor gas mixture which includes between 50 weight percent and 100 weight percent of a noble gas.

13. The method of claim 12 wherein said reactant gas mixture includes between 90 weight percent and 100 weight percent of a noble gas.

14. The method of claim 10 further comprising the step of controlling a temperature of electrons emitted by said hot emitter so as to be of the order of twice a temperature of said reactant gas mixture in said plasma discharge.

15. The method of claim 14 wherein said electron temperature is controlled to be $\geq 10$ times a temperature of said plasma discharge.

16. The method of claim 1 wherein the position of the object being coated is selected so that the temperature therealong is not greater than 900° C. and the plasma density therealong varies by less than 50%.

17. The method of claim 5, wherein said range is between 60% and 100% of maximum plasma density of said plasma discharge.

18. The method of claim 1, wherein a current path is provided interconnecting said object with an electric reference potential and wherein a current flowing from said object through said path is selected to be $\leq 20\%$ of said discharge current I.

19. The method of claim 1, further comprising the step of introducing said carbon donor gas into said vacuum chamber through a plurality of inlet openings distributed in a plate arranged perpendicular to said line.

20. The method of claim 1, further comprising the steps of introducing said carbon donor gas into said vacuum chamber through said multitude of openings.

21. The method of claim 1, further comprising the step of removing said carbon donor gas from said vacuum chamber through said multitude of openings.

22. The method of claim 1, further comprising the step of separating said cathode arrangement from said discharge space by means of said plate, generating electrically charged carriers by providing said cathode arrangement with a hot electron emitting cathode and protecting said hot electron emitting cathode from said reactive plasma enhanced deposition process by providing a flow of a further gas adjacent to said hot electron emitting cathode.

23. The method of claim 1, further comprising the step of introducing said carbon donor gas through the multitude of openings in an electrode defining said anode/cathode discharge space.

24. The method of claim 1, wherein the object being coated is maintained at a temperature in the range of 600° C. to 1100° by the low arc discharge.

* * * * *